United States Patent
Zu et al.

(10) Patent No.: US 9,027,480 B2
(45) Date of Patent: May 12, 2015

(54) INK SOLUTIONS FOR MICROCONTACT PRINTING

(75) Inventors: Lijun Zu, Minneapolis, MN (US); Matthew H. Frey, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 1174 days.

(21) Appl. No.: 12/808,339

(22) PCT Filed: Dec. 15, 2008

(86) PCT No.: PCT/US2008/086754
§ 371 (c)(1),
(2), (4) Date: Jun. 15, 2010

(87) PCT Pub. No.: WO2009/085678
PCT Pub. Date: Jul. 9, 2009

(65) Prior Publication Data
US 2010/0258968 A1  Oct. 14, 2010

Related U.S. Application Data

(60) Provisional application No. 61/014,984, filed on Dec. 19, 2007.

(51) Int. Cl.
*C09D 11/03* (2014.01)
*B41M 3/00* (2006.01)

(52) U.S. Cl.
CPC . *C09D 11/03* (2013.01); *B41M 3/00* (2013.01)

(58) Field of Classification Search
USPC .................................................. 101/491, 492
See application file for complete search history.

(56) References Cited

U.S. PATENT DOCUMENTS

| | | | |
|---|---|---|---|
| 5,512,131 | A | 4/1996 | Kumar et al. |
| 6,518,168 | B1 | 2/2003 | Clem et al. |
| 1,863,853 | A1 | 7/2007 | Drake |
| 2006/0117994 | A1 * | 6/2006 | Ryu et al. ................ 106/31.58 |
| 2006/0121271 | A1 | 6/2006 | Frey et al. |
| 2006/0209117 | A1 | 9/2006 | Parazak |
| 2006/0254387 | A1 | 11/2006 | Lee et al. |

FOREIGN PATENT DOCUMENTS

| | | |
|---|---|---|
| CN | 1863853 | 11/2006 |
| JP | 2007-515510 | 6/2007 |
| JP | 2008-096292 | 4/2008 |
| WO | WO 2006/008251 A2 | 1/2006 |
| WO | WO 2007/085356 A2 | 8/2007 |

OTHER PUBLICATIONS

Bain et al., 1989, *J. Am. Chem. Soc.*, 111(1):321-335 "Formation of Monolayer Films by the Spontaneous Assembly of Organic Thiols from Solutions onto Gold".
Balmer et al., 2005, *Langmuir*, 21:622-632 "Diffusion of Alkanethiols in PDMS and Its Implications on Microcontact Printing".
Burgin et al., 2000, *Langmuir*, 16:5371-5375 "Large Area Submicrometer Contact Printing Using a Contact Aligner".
Choi, et al, 2007, *Curr. Appl. Phys.*, 7(5):522-527 "Photopatterning of gold and copper surfaces by using self-assembled monolayers".
Delmarche et al., 1998, *J. Phys. Chem. B.*, 102:3324-3334 "Transport Mechanisms of Alkanethiols during Microcontact Printing on Gold".
Helmuth et al., 2006, *J. Am. Chem. Soc.*, 128:9296-9297 "High-Speed Microcontact Printing".
Kumar et al., 1993, *Appl. Phys. Lett.*, 63(14):2002-2004 "Features of gold having micrometer to centimeter dimensions can be formed through a combination of stamping with an elastomeric stamp and an alkanethiol "ink" followed by chemical etching".
Kumar et al., 1994, *Langmuir*, 10:1498-1511 "Patterning Self-Assembled Monolayers: Applications in Materials Science".
Larsen et al., 1997, *J. Am. Chem. Soc.*, 119:3017-3026 "Order in Microcontact Printed Self-Assembled Monolayers".
Lee et al., 2003, *Analytical Chemistry*, 75(23):6544-6554 "Solvent Compatibility of Poly(dimethylsiloxane)-Based Microfluidic Devices".
Libioulle et al., 1999, *Langmuir*, 15:300-304 "Contact-Inking Stamps for Microcontact Printing of Alkanethiols on Gold".
Love et al, 2003, *J. Am. Chem. Soc.*, 125:2597-2609 "Formation and Structure of Self-Assembled Monolayers of Alkanethiolates on Palladium".
Love et al., 2005, *Chemical Reviews*, 105:1103-1169 "Self-Assembled Monlayers of Thiolates on Metals as a Form of Naotechnology".
Reichardt, C., ed. *Solvents and Solvent Effects in Organic Chemistry*. $2^{nd}$ ed. Germany: VCH Verlagsgesellschaft mbH, 1988, Section 7.4, pp. 359-384.
Sharpe et al., 2004, *Langmuir*, 20:8646-8651 "Spreading of 16 Mercaptohexadecanoic Acid in Microcontact Printing".
Srinivas et al., 2003, *Biomedical Chromotography*, 17:285-291 "Bioanalytical considerations for compounds containing free sulfhydryl groups".
Ulman, 1996, *Chemical Reviews*, 96:1533-1554 "Formation and Structure of Self-Assembled Monolayers".
Xia et al., 1995, *Chem. Mater.*, 7:2332-2337 "A Selective Etching Solution for Use with Patterned Self-Assembled Monolayers of Alkanethiolates on Gold".
Xia et al., 1995, *J. Am. Chem. Soc.*, 117:9576-9577 "Microcontact Printing of Octadecylsiloxane on the Surface of Silicon Dioxide and Its Application in Microfabrication".
PCT International Search Report for PCT/US2008/086754 dated Mar. 16, 2009.
Xia, et al., "Soft Lithography," Angew. Chem. Int. Ed. 1998, vol. 37, pp. 550-575.

\* cited by examiner

*Primary Examiner* — Joshua D Zimmerman
(74) *Attorney, Agent, or Firm* — Adrian L. Pishko; Gregory D. Allen

(57) ABSTRACT

An ink solution comprises (a) a solvent having (i) a boiling point between about 50° C. and about 100° C., (ii) a relative polarity of less than about 0.4, and (iii) a poly(dimethylsiloxane) swelling ratio of less than about 1.25; and (b) one or more dissolved organosulfur compounds, wherein each organosulfur compound has 10 or more carbon atoms. The one or more organosulfur compounds are present in a total concentration of at least about 3 mM, and the ink solution contains essentially no solid particles of the organosulfur compounds or solid particles derived from the organosulfur compounds.

27 Claims, No Drawings

US 9,027,480 B2

INK SOLUTIONS FOR MICROCONTACT PRINTING

CROSS REFERENCE TO RELATED APPLICATIONS

This application is a national stage filing under 35 U.S.C. 371 of PCT/US2008/086754, filed Dec. 15, 2008, which claims priority to U.S. Application No. 61/014,984, filed Dec. 19, 2007, the disclosure of which is incorporated by reference in its/their entirety herein.

FIELD

This invention relates to ink solutions that are useful, for example, for microcontact printing self-assembled monolayers. In another aspect, this invention relates to a method of microcontact printing.

BACKGROUND

Microcontact printing is a printing technique that can be used, for example, to generate patterns of functionalizing molecules (that is, molecules that attach to a substrate surface or coated substrate surface via a chemical bond) to form a patterned self-assembled monolayer (SAM) (that is, a single layer of molecules that are attached, for example, by a chemical bond to a surface and that have adopted a preferred orientation with respect to that surface and even with respect to each other).

The basic method for microcontact printing SAMs involves applying an ink containing functionalizing molecules to a relief-patterned elastomeric stamp (for example, a poly(dimethylsiloxane) (PDMS) stamp) and then contacting the inked stamp to a substrate surface, usually a metal or metal oxide surface, so that SAMs form in the regions of contact between the stamp and the substrate. Typically, for inks comprising functionalizing molecules dissolved in a solvent, there are tradeoffs in printing performance and certain aspects of practical implementation that drive the selection of concentration for the molecules. In some circumstances, it is desirable to use the highest ink concentration possible because using higher ink concentrations can shorten print time, but the use of such high concentrations has presented practical challenges related to ink stability. In the past, stable ink formulations at high concentration have required the use of solvents (for example, hexane) that undesirably swell PDMS stamps.

The most commonly used inks for microcontact printing SAMs are ethanolic solutions of alkyl thiols. Unfortunately, however, alkyl thiols have a relatively low solubility and stability in ethanol. Inks comprising alkyl thiols in ethanol therefore typically contain a relatively low concentration of alkyl thiol.

SUMMARY

In view of the foregoing, we recognize that there is a need in the art for alkyl thiol inks having increased concentrations of alkyl thiol. We further recognize that the ink must be compatible with PDMS because PDMS is the most commonly used material for microcontact printing stamps. In addition, we recognize that the inks must also have a useful shelf life to be suitable for commercial applications. We also recognize that solvent contained in the ink may advantageously exhibit vapor pressure in a preferred range, as suggested by a range of boiling points, in order to aid in the application and uniform distribution of the alkyl thiol molecules on or within the stamp.

Briefly, in one aspect, the present invention provides an ink solution comprising one or more dissolved organosulfur compounds and a solvent, the solvent having (i) a boiling point between about 50° C. and about 100° C., (ii) a relative polarity of less than about 0.4, and (iii) a poly(dimethylsiloxane) swelling ratio of less than about 1.25. Each organosulfur compound has 10 or more carbon atoms, and the organosulfur compound(s) are present in a total concentration of at least about 3 mM. The ink solution contains essentially no solid particles of the organosulfur compounds or solid particles derived from the organosulfur compounds. Preferably, each organosulfur compound is a thiol compound. More preferably, each is an alkyl thiol.

The ink solutions of the present invention meet the need in the art for alkyl thiol inks having increased concentrations of alkyl thiol. Their increased concentration of organosulfur compound (for example, alkyl thiol) can enable microcontact printing at higher speeds and therefore reduce printing costs. In addition, they are compatible with PDMS and have a useful shelf life.

In another aspect, the present invention provides a method of microcontact printing using the ink solutions of the invention. The method comprises (a) inking an elastomeric stamp with an ink solution of the invention, and (b) contacting an inked surface of the stamp to a surface of a substrate. The inked surface of the stamp comprises a first relief pattern, or the surface of the substrate comprises a second relief pattern, or both of the surfaces comprise the relief patterns. A pattern of the organosulfur compound is transferred to the substrate according to one or both of the relief patterns.

DETAILED DESCRIPTION

The ink solutions of the present invention comprise one or more organosulfur compounds. Each organosulfur compound is preferably a thiol compound; more preferably, a thiol compound that forms a SAM. Thiols are compounds that include the —SH functional group. Thiols are alternatively called mercaptans. The thiol group is useful for creating a chemical bond between molecules of the compound and the surface of a metal. Useful thiols of the present invention include alkyl thiols and aryl thiols. Other useful organosulfur compounds of the present invention are dialkyl disulfides, dialkyl sulfides, alkyl xanthates, dithiophosphates, and dialkylthiocarbamates. The useful chemical structures and substituents for thiols, as described herein, also apply to the other useful organosulfur compounds.

Preferably the ink solution comprises alkyl thiols such as, for example, linear alkyl thiols:

$HS(CH_2)_nX$ wherein n is the number of methylene units and X is the end group of the alkyl chain (for example, X=—CH$_3$, —OH, —COOH, —NH$_2$, or the like). Preferably, X=—CH$_3$. The invention is not limited in terms of the chemical identity of the end group for the useful linear alkyl thiols. Useful end groups include those described, for example, in: (1) Ulman, "Formation and Structure of Self-Assembled Monolayers," *Chemical Reviews* Vol. 96, pp. 1533-1554 (1996); and (2) Love et al., "Self-Assembled Monolayers of Thiolates on Metals as a Form of Nanotechnology," *Chemical Reviews* Vol. 105, pp. 1103-1169 (2005).

Useful alkyl thiols can be linear alkyl thiols (that is, straight chain alkyl thiols) or branched and can be substituted or unsubstituted. The optional substituents preferably do not interfere with the formation of a SAM. Examples of branched alkyl thiols that are useful include alkyl thiols with a methyl group attached to every third or every fourth carbon atom of a linear alkyl chain backbone (for example, phytanylthiol). Examples of mid-chain substituents within useful alkyl thiols include ether groups and aromatic rings. Useful thiols can also include three-dimensional cyclic compounds (for example, 1-adamantanethiol). The invention is not limited in terms of the optional branching structure or the chemical identity of any optional mid-chain substituents.

Preferred linear alkyl thiols have 10 to 20 carbon atoms (more preferably, 12 to 20 carbon atoms; most preferably 16 carbon atoms, 18 carbon atoms, or 20 carbon atoms).

Suitable alkyl thiols include commercially available alkyl thiols (Aldrich Chemical Company, Milwaukee, Wis.). Preferably, the ink solutions consist primarily of a solvent and the organosulfur compound, with impurities comprising less than about 5 percent by weight of the ink solution; more preferably less than about 1 percent; even more preferably less than about 0.1 percent. Common impurities in alkyl thiol solutions are dialkyl disulfides, an oxidation product of alkyl thiols. As is known in the art, dialkyl disulfides are also useful for microcontact printing patterns of functionalizing molecules. Useful inks according to the invention can contain mixtures of different organosulfur compounds dissolved in a common solvent such as, for example, mixtures of alkyl thiol and dialkyl disulfide.

Aryl thiols are also useful. Aryl thiols include a thiol group attached to an aromatic ring. Examples of useful aryl thiols include biphenyl thiols and terphenyl thiols. The biphenyl and terphenyl thiols can be substituted with one or more functional groups at any of a variety of locations. Other examples of useful aryl thiols include acene thiols, which may or may not be substituted with functional groups. The invention is not limited in terms of the presence or not of aryl groups in the thiol molecules.

Useful thiols can include linear conjugated carbon-carbon bonds, for example double bonds or triple bonds. Useful thiols can be partially or completely fluorinated.

The ink solutions of the present invention can include two or more chemically distinct organosulfur compounds. For example, the ink can include two linear alkyl thiol compounds with different chain length. As another example, the ink can include two linear alkyl thiol compounds with different tail groups.

Although microcontact printing has been carried out using neat organosulfur compounds to ink the stamp, the delivery of organosulfur compounds to the stamp can be achieved more uniformly, and with less stamp swelling in the case of linear alkyl thiols and PDMS stamps, if delivered from a solvent-based ink. Although it is within the scope of the invention to use more than one solvent in the ink formulations, useful formulations include those formulated with one solvent. Inks formulated with only one solvent may contain small amounts of impurities or additives, for example stabilizers or desiccants.

The improvement of ink formulations for microcontact printing has been discovered to require a challenging combination of properties from the solvent used to dissolve the organosulfur compound. The improvement of solvent-containing ink formulations for microcontact printing has required simultaneously (i) an ability to dissolve greater concentrations of the organosulfur compound (for example, linear alkyl thiol) with greater stability (for example, shelf life); (ii) an ability to charge the organosulfur compound (for example linear alkyl thiol) onto or into a PDMS stamp without excessive swelling of the PDMS; and (iii) an ability to remove liquid solvent from the stamp surface rapidly by drying, after inking. Accordingly, ink formulations with improvements in these aspects are disclosed herein.

The one or more organosulfur compounds (for example, thiol compounds; preferably a linear alkyl thiol compound) are dissolved in a solvent. It is important for the solvent to have tailored drying behavior for rapid and uniform deposition of the organosulfur compound on or within the stamp. The need for this tailored drying behavior follows from the requirement for a manufacturing process to proceed at a high rate. Useful solvents have a boiling point between about 50° C. and about 100° C. (at atmospheric pressure). Preferably, the solvent has a boiling point between about 55° C. and about 85° C. (at atmospheric pressure). More preferably, the solvent has a boiling point between about 55° C. and about 77° C. (at atmospheric pressure).

Useful solvents are preferably compatible with PDMS (that is, they do not excessively swell PDMS), which is the most commonly used material for microcontact printing. Some common solvents such as, for example, toluene and diethyl ether can swell PDMS too much to be used effectively in microcontact printing. In microcontact printing, swelling of the PDMS stamp can lead to distortion of the patterned features and poor pattern fidelity. Depending on the inking approach, excessive swelling can also present significant challenges in providing mechanical support to the stamp.

Solvents useful in the ink solutions of the invention, therefore, have a relatively low poly(dimethylsiloxane) swelling ratio. As used herein, a "poly(dimethylsiloxane) swelling ratio" or a "PDMS swelling ratio" means $D/D_0$, wherein D is the length of a piece of PDMS in a solvent and $D_0$ is the length of the same piece of PDMS when dry. More specifically, as used herein, "poly(dimethylsiloxane) swelling ratio" refers to the ratio, calculated as described above, for Sylgard™ 184 PDMS, commercially obtainable from Dow Corning, Midland, Mich. The procedure for measuring the swelling ratio is described in Lee et al., "Solvent Compatibility of Poly(dimethylsiloxane)-Based Microfluidic Devices, *Analytical Chemistry* Vol. 75, pp. 6544-6554 (2003). The procedure is briefly described here: The two PDMS components (base and curing agent) are mixed at 10:1 ratio by weight (base:curing agent) and degassed under vacuum. The mixture of base and curing agent is cured into a sheet with approximately 1 millimeter thickness at 70° C. for 24 hours. Hexagonal-shaped samples are cut from the sheet, measuring approximately 4 millimeters from one face to the opposite face (of the hexagon). The piece of PDMS is immersed in the solvent to be tested for 24 hours at 25° C. The distance between opposing faces of the hexagon (D) is measured using a stereoscope and a charge-coupled device (CCD) camera, while the PDMS sample is immersed in the solvent, and compared with the starting distance ($D_0$). Preferably, the solvent has a PDMS swelling ratio of less than about 1.25 (more preferably less than about 1.10; most preferably 1.06 or less).

Useful solvents have a relative polarity of less than about 0.5. Preferably, useful solvents have a relative polarity of less than about 0.4. More preferably, the solvent has a relative polarity between about 0.2 and about 0.4. The relative polarity is the normalized transition energy for the longest wavelength solvatochromic absorption band of the pyridinium-N-phenoxide betaine dye, as described in detail in *Solvents and Solvent Effects in Organic Chemistry*, Second Edition, C. Reichardt, VCH Verlagsgesellschaft mbH, Germany (1988). The normalization creates a unitless relative polarity scale bounded by tetramethylsilane at 0.000 and water at 1.000. Values of relative polarity for most solvents can be found in the aforementioned volume by Reichardt.

Ketones can be suitable solvents for the ink solutions of the invention. Preferred solvents include, for example, acetone, methyl ethyl ketone, ethyl acetate, and the like, and combinations thereof. Acetone is a particularly preferred solvent.

The one or more organosulfur compounds (for example, thiol compounds) are present in the solvent in a total concentration of at least about 3 mM. As used herein, the "total concentration" refers to the molar concentration of all the dissolved organosulfur compounds taken in aggregate. The one or more organosulfur compounds (for example, thiol compounds) can be present in any total concentration in which the ink solution consists of essentially a single phase. The one ore more organosulfur compounds (for example, thiol compounds) can be present in total concentrations of at least about 5 mM, at least about 10 mM, at least about 20 mM, at least 50 mM, and even at least about 100 mM.

In one embodiment, the ink comprises an alkyl thiol compound having 19 or more carbon atoms (preferably, 20 carbon atoms) that is present in a concentration of at least about 3 mM. In another embodiment, the ink comprises an alkyl thiol compound having 17 to 18 carbon atoms (preferably, 18 carbon atoms) that is present in a concentration of at least about 5 mM. In yet another embodiment, the ink comprises an alkyl thiol compound having 10 to 16 carbon atoms (preferably, 16 carbon atoms) that is present in a concentration of at least about 20 mM.

The ink solutions of the present invention contain essentially no solid particles of the organosulfur compounds or solid particles derived from the organosulfur compounds. Any solid particles of the organosulfur compounds or solid particles derived from the organosulfur compounds are typically present at a level of less than about 10 percent by weight of the total content of organosulfur compounds; preferably less than about 5 percent; more preferably less than about 1 percent. Most preferably the ink solutions do not contain any (that is, zero percent) solid particles of the organosulfur compound or solid particles derived from the organosulfur compound.

Solid particles of the organosulfur compounds or solid particles derived from the organosulfur compounds (referred to hereinafter as "organosulfur particles") include, for example, undissolved particles of the organosulfur compounds, reprecipitated particles of the organosulfur compounds, and solid reaction products derived from the organosulfur compounds (for example, crystals, gelatinous precipitates, or flocs of oxidation products of the organosulfur compounds).

For the purpose of determining whether a given ink solution contains essentially no organosulfur particles, it will be understood by those skilled in the art that any useful contiguous volume of ink solution that contains essentially no organosulfur particles meets this essentially no organosulfur particles requirement even if such useful volume is in contact with a volume of solution that includes organosulfur particles. A contiguous volume of ink solution shall be considered a "useful" volume as long as there is enough of it to use it for its intended purpose (even while it is contact with the organosulfur particle-containing solution). For some applications, a useful volume is at least about 5 milliliters.

Stated differently, contact with a volume of organosulfur particle-containing solution does not necessarily make a useful contiguous volume of organosulfur particle-free ink solution no longer essentially free of organosulfur compounds. For example, if an ink solution is centrifuged or settled gravitationally such that the supernatant solution contains essentially no organosulfur particles, but the supernatant solution is still in contact with a bed of settled or packed organosulfur particles, the supernatant solution can still meet the essentially no organosulfur particles requirement.

Furthermore, it will be understood by those skilled in the art that if organosulfur particles (for example, relatively large organosulfur particles such as, for example, particles having a diameter greater than about 10 microns) are suspended in an ink solution, a portion of the ink solution is still be considered to contain essentially no organosulfur particles if the organosulfur compounds have been isolated from that portion, for example, by filtration.

Surprisingly, the ink solutions of the invention can have useful lifetimes longer than inks containing alkyl thiol in other solvents such as, for example, ethanol. In some embodiments, the ink solutions of the invention can be stable for at least about 7 days (preferably, at least about 14 days; more preferably, at least about 30 days; most preferably, at least about 60 days). As used herein, "stable" for at least "x" days means that no precipitates can be observed by the naked eye after "x" days when the ink solution has been kept in a sealed container with limited exposure to light (preferably, with no exposure to light). Stability or "shelf life" can be measured, for example, as described below in Procedure 1.

Optionally, the ink solutions of the invention may contain additives. Examples of useful additives are additives that may help to stabilize the organosulfur compound (for example, as described in Srinivas et al., "Bioanalytical considerations for compounds containing free sulfhydryl groups," *Biomedical Chromotography* Vol. 17, pp. 285-291 (2003)).

The thiol ink solutions of the invention can be microcontact printed to provide patterned SAMs. Patterned SAMs formed from thiols are useful, for example, as etch resists, templates for crystallization, and model surfaces for biological studies. As is known in the art, the printing of an organosulfur compound onto a surface, resulting in chemical functionalization of that surface, can include a displacement reaction that results in removal or modification of an atom or functional group in the compound. The most common example of these modifications is the conversion of a thiol (R—SH compound) to a thiolate (R—S-M) monolayer when the monolayer is formed on a metal (M), for example gold, as described, for example, in Love et al., "Self-Assembled Monolayers of Thiolates on Metals as a Form of Nanotechnology," *Chemical Reviews* Vol. 105, pp. 1103-1169 (2005). Thus, the invention includes microcontact printing using inks comprising one or more organosulfur compounds, generating a pattern of an organosulfur compound on a substrate, wherein the organosulfur compound comprising the pattern may be chemically different from the organosulfur compound(s) in the ink.

Microcontact printing typically utilizes a relief-patterned elastomeric stamp. Useful elastomers for forming the stamp include silicones, polyurethanes, EPDM rubbers, as well as the range of existing commercially available flexographic printing plate materials (for example, commercially available from E. I. du Pont de Nemours and Company, Wilmington, Del., under the trade name Cyrel™). The stamp can be made from a composite material.

PDMS is particularly useful. It is elastomeric and has a low surface energy, which makes it easy to remove the stamp from most substrates. PDMS is commercially available. A useful commercially available formulation of PDMS is Sylgard™ 184 (Dow Corning, Midland, Mich.). PDMS stamps can be formed, for example, by dispensing an uncrosslinked PDMS polymer into or against a patterned mold, followed by curing. The patterned features can be, for example, millimeter-sized, micrometer-sized or nanometer-sized.

The stamp can be "inked" with the ink solution of the invention using methods known in the art (for example, as described in Libioulle et al. "Contact-Inking Stamps for Microcontact Printing of Alkanethiols on Gold," *Langmuir* Vol. 15, pp. 300-304 (1999)). In one approach, an applicator (for example, a cotton swab or a foam applicator) impregnated with the ink solution can be rubbed across the relief-patterned surface of the stamp, followed by drying of solvent from the stamp surface. In another approach, the stamp can be pressed against an "ink pad" impregnated with the ink solution, the ink pad optionally being a PDMS slab. In another approach, the stamp can be charged with ink solution from its back side, relative to the printing surface. In the latter approach, the organosulfur compound diffuses through the stamp to reach the relief-patterned face for printing. Alternatively, the relief-patterned printing face of the stamp can be immersed in the ink solution, followed by withdrawal and drying ("immersive inking"). All of the above described methods of inking render the relief-patterned stamp surface inked, yielding an "inked surface."

Once inked, the stamp is useful for transferring a pattern of an organosulfur compound to the surface of a substrate. When the inked surface of the stamp comprises a relief pattern, the inked surface can be contacted to a surface of a substrate that is essentially flat in order to transfer a pattern of the organosulfur compound to the surface of the substrate, wherein the pattern of the organosulfur compound is essentially the same as the pattern of raised features in the relief pattern of the inked surface of the stamp. In such a process, the pattern of organosulfur compound is said to be transferred according to the relief pattern of the inked surface of the stamp. When the inked surface of a the stamp is essentially flat, the inked surface can be contacted to a surface of a substrate that comprises a relief pattern in order to transfer a pattern of the organosulfur compound to the surface of the substrate, wherein the pattern of the organosulfur compound is essentially the same as the pattern of raised features in the relief pattern of the surface of the substrate. In such a process, the pattern of organosulfur compound is said to be transferred according to the relief pattern of the surface of the substrate. When the inked surface of the stamp comprises a first relief pattern, the inked surface can be contacted to a surface of a substrate that comprises a second relief pattern in order to transfer a pattern of the organosulfur compound that is defined by the regions of contact between the raised features of the first relief pattern and the raised features of the second relief pattern (that is, the intersection of relief patterns). In such a process, the pattern of the organosulfur compound is said to be transferred according to both of the relief patterns.

Preferably, for the achievement of manufacturing efficiency in the use of the immersive inking approach, it is desired the inking time (that is, the time the stamp is in contact with the ink) is as short as possible, while still yielding an inked stamp with adequate printing performance. It is also desirable that the drying time be as short as possible. These latter two factors drive the desire for ink formulations that are stable at high concentration and that can be dried rapidly on the stamp surface. The ability for the ink solvent to be evaporated rapidly from the stamp surface is helpful for achieving a uniform distribution of the thiol molecules on or within the stamp with a minimum of time and application of forced air. For immersive inking it is preferred that the inking time is less than about 60 seconds, more preferably less than about 45 seconds, more preferably less than about 30 seconds, and even more preferably less than about 15 seconds. After withdrawal and drying, the inked stamp can then be placed in contact with a substrate such that contact is made with the raised regions of the relief-patterned surface of the stamp. The organosulfur compounds (for example, thiols) diffuse from the stamp onto the surface of the substrate where they can form SAMs.

The substrate is the surface on which the SAM forms. The term "substrate" is also used to refer to the physical support under such surface. Typically, the substrate comprises a substantially planar surface. Useful substrates can comprise an inorganic material (for example, metallic or metal oxide material, including polycrystalline materials) coating on a polymeric film, or on a glass or silicon wafer. The inorganic material coating can include, for example, elemental metal, metal alloys, intermetallic compounds, metal oxides, metal sulfides, metal carbides, metal nitrides, and combinations thereof. Exemplary metallic surfaces for supporting SAMs include gold, silver, palladium, platinum, rhodium, copper, nickel, iron, indium, tin, tantalum, as well as mixtures, alloys, and compounds of these elements. Gold is a preferred metallic surface. Metal coatings on the polymeric film or glass or silicon wafer substrate can be any thickness such as, for example, from about 10 to about 1000 nanometers. The inorganic material coating can be deposited using any convenient method, for example sputtering, evaporation, chemical vapor deposition, or chemical solution deposition (including electroless plating).

The printing time (that is, the duration of contact between the stamp and the substrate) required will depend upon various factors including, for example, the concentration or the ink solution and the pressure applied to the stamp. In some embodiments, the print time is less than 1 minute (preferably, less than about 30 seconds; more preferably, less than about 10 seconds; most preferably, less than about 5 seconds).

In addition to the use of the inks for microcontact printing patterns of organosulfur compounds (preferably thiol compounds) on essentially flat substrates using relief-structured stamps, the pattern of organosulfur compound defined by the relief pattern of the stamp, the inks are useful for microcontact printing patterns of organosulfur compounds (preferably thiol compounds) on relief-structured substrates using essentially flat stamps or printing plates, the pattern of organosulfur compound defined by the relief pattern of the substrate. U.S. Pat. No. 6,518,168 describes this "reverse" microcontact printing process.

While microcontact printing is a preferred method for patterned SAMs formed from the thiol ink solutions of the invention, it should be appreciated that other methods of patterning can be used. Other known methods for patterning SAMs include, for example, ink jet printing, use of the formation of gradients of the functional groups, and topographically directed assembly.

The patterned SAM formed from the thiol ink solutions of the invention can be used, for example, as a resist that protects regions the underlying substrate surface during a subsequent patterning step. For example, the patterned SAM can provide an etch mask. As an etch mask, the regions of the substrate surface (for example, the surface of a metal coating on a polymeric film substrate) that are covered with the SAM are protected against the chemical action of an etchant, while regions of the substrate surface that are not covered with the SAM are not protected, allowing selective removal of material (for example, metal from a polymeric film substrate) in the unprotected regions. Alternatively, the patterned SAM can provide a plating mask. As a plating mask, the regions of the substrate surface (for example, the surface of a catalytic metal coating on a polymeric film substrate) that are covered with the SAM are rendered non-catalytic for deposition of metal from an electroless plating bath, while regions of the substrate surface that are not covered with the SAM remain exposed and therefore retain their catalytic activity, allowing for the selective placement of electrolessly deposited metal in the unprotected regions. Methodologies for the application of patterned SAMs as masks in the patterning of other materials are known in the art (for example, in U.S. Pat. No. 5,512,131).

EXAMPLES

Objects and advantages of this invention are further illustrated by the following examples, but the particular materials and amounts thereof recited in these examples, as well as other conditions and details, should not be construed to unduly limit this invention.

Ink Examples
Materials
Ethanol (PHARMCO-AAPER and Commercial Alcohols, Shelbyville, Ky., under the product description Alcohol, 200 proof, absolute, anhydrous, ACS/USP Grade)
Acetone (EMD Chemicals Inc., division of Merck KGaA, Darmstadt, Germany. Product No. AX0120-6)
1-Hexadecanethiol (Alfa-Aesar, Ward Hill, Mass., catalog number L15099)
1-Octadecanethiol (98%, Aldrich Chemical Company, Milwaukee, Wis., catalog number O1858)
1-Eicosanethiol (Robinson Brothers, West Bromwich, England)
Syringe filters (Pall Corporation, East Hills, N.Y., product Acrodisc CR 25 mm Syringe Filter with 0.2 micron PTFE membrane).
Glass vials (Wheaton, Millville, N.J., 20 ml clear glass, with POLY-SEAL caps)

Procedure 1

The appropriate amounts of alkyl thiol and solvent were calculated in order to prepare approximately 10 milliliters of solution at a target concentration, based on the molecular weight of the alkyl thiol and the density of the solvent, as is known in the art. Materials listed above were used as-received. Alkyl thiol was weighed into a glass vial. Solvent was weighed into the glass vial. The vial was capped. For solutions based on ethanol, the mixture was stirred for 4 hours with a magnetic stir bar. For solutions based on acetone, the mixture was stirred for 1 hour with a magnetic stir bar. After dissolution, the solution was filtered using the syringe filter and sealed into a glass vial, capped tightly, and wrapped with aluminum foil. The vial was inspected over time to determine when precipitation of visible particles occurred. The time before visible precipitates form was taken as the shelf life of the ink solution.

Examples 1-6 and Comparative Examples 1C-6C

Hexadecanethiol Inks

Solutions were made according to Procedure 1, with the concentrations and solvent identity listed in Table 1. In all cases, the thiol was 1-hexadecanethiol. For entries related to Time to precipitation of ">210," precipitation had not yet occurred at the time of the last inspection (at 210 days).

TABLE 1

| Example | Solvent | Concentration of thiol (mM = $10^{-3}$ Molar) | Time to precipitation (days) |
| --- | --- | --- | --- |
| 1 | Acetone | 10 mM | >210 |
| 2 | Acetone | 20 mM | >210 |

TABLE 1-continued

| Example | Solvent | Concentration of thiol (mM = $10^{-3}$ Molar) | Time to precipitation (days) |
| --- | --- | --- | --- |
| 3 | Acetone | 50 mM | >210 |
| 4 | Acetone | 100 mM | >210 |
| 5 | Acetone | 200 mM | 9 |
| 6 | Acetone | 500 mM | 7 |
| 1C | Ethanol | 10 mM | 180 |
| 2C | Ethanol | 20 mM | 55 |
| 3C | Ethanol | 50 mM | 35 |
| 4C | Ethanol | 100 mM | 10 |
| 5C | Ethanol | 200 mM | <1 |
| 6C | Ethanol | 500 mM | <1 |

Examples 7-11 and Comparative Examples 7C-11C

Octadecanethiol Inks

Solutions were made according to Procedure 1, with the concentrations and solvent identity listed in Table 2. In all cases, the thiol was 1-octadecanethiol. For entries related to Time to precipitation of ">210," precipitation had not yet occurred at the time of the last inspection (at 210 days). Entries of N/A indicate formulations where the target concentration apparently exceeded the solubility limit (that is, the thiol did not fully dissolve).

TABLE 2

| Example | Solvent | Concentration of thiol (mM = $10^{-3}$ Molar) | Time to precipitation (days) |
| --- | --- | --- | --- |
| 7 | Acetone | 2 mM | >210 |
| 8 | Acetone | 5 mM | >210 |
| 9 | Acetone | 10 mM | >210 |
| 10 | Acetone | 20 mM | 120 |
| 11 | Acetone | 50 mM | N/A |
| 7C | Ethanol | 2 mM | 48 |
| 8C | Ethanol | 5 mM | 13 |
| 9C | Ethanol | 10 mM | 8 |
| 10C | Ethanol | 20 mM | 4 |
| 11C | Ethanol | 50 mM | N/A |

Examples 12-17 and Comparative Examples 12C-17C

Eicosanethiol Inks

Solutions were made according to Procedure 1, with the concentrations and solvent identity listed in Table 3. In all cases, the thiol was 1-eicosanethiol. For entries related to Time to precipitation of ">120," precipitation had not yet occurred at the time of the last inspection (at 120 days).

TABLE 3

| Example | Solvent | Concentration of thiol (mM = $10^{-3}$ Molar) | Time to precipitation (days) |
| --- | --- | --- | --- |
| 12 | Acetone | 1 mM | >120 |
| 13 | Acetone | 2 mM | >120 |
| 14 | Acetone | 3 mM | >120 |
| 15 | Acetone | 5 mM | >120 |
| 16 | Acetone | 10 mM | >120 |
| 17 | Acetone | 20 mM | 100 |
| 12C | Ethanol | 1 mM | 110 |

TABLE 3-continued

| Example | Solvent | Concentration of thiol (mM = $10^{-3}$ Molar) | Time to precipitation (days) |
|---|---|---|---|
| 13C | Ethanol | 2 mM | 85 |
| 14C | Ethanol | 3 mM | 29 |
| 15C | Ethanol | 5 mM | 7 |
| 16C | Ethanol | 10 mM | 1 |
| 17C | Ethanol | 20 mM | 1 |

Microcontact Printing Examples
Materials
Ethanol (PHARMCO-AAPER and Commercial Alcohols, Shelbyville, Ky., under the product description Alcohol, 200 proof, absolute, anhydrous, ACS/USP Grade)
Acetone (EMD Chemicals Inc., division of Merck KGaA, Darmstadt, Germany. Product No. AX0120-6)
1-Hexadecanethiol (Alfa-Aesar, Ward Hill, Mass., catalog number L15099)
Ferric nitrate (J. T. Baker, Phillipsburg, N.J., product number 2018-01)
Thiourea (Aldrich Chemical Company, Milwaukee, Wis., catalog number T8656-100G)
PDMS (Dow Corning Corporation, Midland Mich., product Sylgard™ 184)
Gold-coated polyethylene naphthalate (PEN) film substrate (PEN: E. I. du Pont de Nemours and Company, Wilmington, Del., product TEIJEN™ TEONEX™ Q65FA; sputter-coated with 70 nanometer thick gold film)
Procedure 2

Ink solutions were prepared by dissolving the appropriate amounts of 1-hexadecanethiol in acetone or ethanol with stirring, and stored in sealed glass vials. A PDMS stamp was prepared by molding (85° C. for 12 hours) the 10:1 two-part formulation, mixed per the manufacturer's recommendation, against a silicon wafer bearing a pattern of photoresist. The photoresist defined an approximately 50 micron deep relief pattern. The photoresist pattern, in the plane, comprised one half millimeter-wide recessed lines, spaced apart by approximately 2 millimeters. Thus, the PDMS stamp included a stamping surface with a 50 micron-deep relief pattern, the pattern in the plane comprising one half millimeter-wide raised lines, spaced apart by approximately 2 millimeters. Etchant solution for selectively removing gold (and hence patterning the gold) was prepared by dissolving the appropriate amounts of ferric nitrate and thiourea in deionized water to yield 20 mM and 30 mM concentrations respectively, based on the molecular weights for the reagents and the density of water. The etchant was prepared by dissolution of the reagents with stirring, and it was used the same day. For printing, the stamping surface of a PDMS stamp was immersed into the ink solution for a prescribed length of time, blown dry with compressed nitrogen, contacted to the gold coating surface for a prescribed length of time ("print time"), and then removed. After printing, the printed surface was immersed in the etchant solution for 20 minutes. The pattern of gold coating that resulted was examined at 50× magnification using an optical microscope in transmission mode (Olympus Model BH-2, equipped with Olympus DP12 digital camera, Olympus Optical Co. Ltd, Tokyo, Japan).

Example 18 and Comparative Example 18C

For 1-hexadecane-based ink solutions in acetone vs. ethanol, a concentration was selected for each that leads to comparable, desirable stability (for example, shelf life, as described in the above examples). The printing performance of an ink solution comprising 10 mM 1-hexadecanethiol in ethanol (Example 18C), 180 days=6 month shelf life, was compared with that of an ink solution comprising 50 mM 1-hexadecanethiol in acetone (Example 18), >210 days=>7 month shelf life. The immersion inking time was 40 seconds in each case. The stamp contact time with the gold-coated film substrate ("print time") was 5 seconds in each case. After stamping, the gold-coated film substrate was etched, resulting in the removal of the gold from the unstamped regions. The gold that remained in the stamped regions for Example 18 appeared identical in its optical density and pinhole density to the starting gold-coated film, based on inspection using the optical microscope. In contrast, the gold that remained in the stamped regions for Comparative Example 18C was reduced in its optical density (indicating that it had been thinned during the etching step, due to inadequate protection) and had higher pinhole density, compared with the starting gold-coated film, based on inspection using the optical microscope.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. An ink solution comprising:
   (a) a solvent, wherein the solvent has (i) a boiling point between about 50° C. and about 100° C., (ii) a relative polarity of less than about 0.4, and (iii) a poly(dimethylsiloxane) swelling ratio of less than about 1.25; and
   (b) one or more dissolved organosulfur compounds, wherein each organosulfur compound is an alkyl thiol having 10 or more carbon atoms;
   wherein the one or more dissolved organosulfur compounds are present in a total concentration of at least about 3 mM, and the ink solution contains essentially no solid particles of the organosulfur compounds or solid particles derived from the organosulfur compounds.

2. The ink solution of claim 1 wherein the solvent has a boiling point between about 55° C. and about 77° C.

3. The ink solution of claim 1 or 2 wherein the solvent has a relative polarity between about 0.2 and about 0.4.

4. The ink solution of claim 1 wherein the solvent has a poly(dimethylsiloxane) swelling ratio of less than about 1.10.

5. The ink solution of claim 1 wherein each thiol compound has 10 to 20 carbon atoms.

6. The ink solution of claim 5 wherein each thiol compound has 16 carbon atoms, 18 carbon atoms, or 20 carbon atoms.

7. The ink solution of claim 1 wherein the one or more dissolved organosulfur compounds are present in a total concentration of at least about 5 mM.

8. The ink solution of claim 7 wherein the one or more dissolved organosulfur compounds are present in a total concentration of at least about 10 mM.

9. The ink solution of claim 8 wherein the one or more dissolved organosulfur compounds are present in a total concentration of at least about 20 mM.

10. The ink solution of claim 9 wherein the one or more dissolved organosulfur compounds are present in a total concentration of at least about 100 mM.

11. The ink solution of claim 1 wherein solid particles of the organosulfur compounds or solid particles derived from the organosulfur compounds are present in the ink solution in an amount less than about 10 percent by weight of the total content of organosulfur compounds.

12. The ink solution of claim 11 wherein solid particles of the organosulfur compounds or solid particles derived from the organosulfur compounds are present in the ink solution in an amount less than about 5 percent by weight of the total content of organosulfur compounds.

13. The ink solution of claim 12 wherein solid particles of the organosulfur compounds or solid particles derived from the organosulfur compounds are present in the ink solution in an amount less than about 1 percent by weight of the total content of organosulfur compounds.

14. The ink solution of claim 13 wherein the ink solution does not contain any solid particles of the organosulfur compounds or solid particles derived from the organosulfur compounds.

15. The ink solution of claim 1 wherein the one or more dissolved organosulfur compounds is an alkyl thiol having 10 to 16 carbon atoms and is present in a concentration of at least about 20 mM.

16. The ink solution of claim 1 wherein the one or more dissolved organosulfur compounds is an alkyl thiol having 17 to 18 carbon atoms and is present in a concentration of at least about 5 mM.

17. The ink solution of claim 1 wherein the one or more dissolved organosulfur compounds is an alkyl thiol having 19 or more carbon atoms and is present in a concentration of at least about 3 mM.

18. The ink solution of claim 1 wherein the ink solution is stable for at least 14 days.

19. The ink solution of claim 18 wherein the ink solution is stable for at least 30 days.

20. The ink solution of claim 19 wherein the ink solution is stable for at least 60 days.

21. A method of microcontact printing comprising:
(a) inking an elastomeric stamp with the ink solution of claim 1; and
(b) contacting an inked surface of the stamp to a surface of a substrate;
wherein the inked surface of the stamp comprises a first relief pattern, or the surface of the substrate comprises a second relief pattern, or both of the surfaces comprise the relief patterns; and
wherein a pattern of an organosulfur compound is transferred to the substrate according to one or both of the relief patterns.

22. The method of claim 21 wherein the inked surface of the stamp comprises poly(dimethylsiloxane).

23. The method of claim 21 or 22 further comprising etching the portions of the substrate not containing the organosulfur compound.

24. The method according to any one of claims 21 to 23 wherein the pattern of the organosulfur compound comprises millimeter-sized features.

25. The method of claim 21 wherein the inked surface of the stamp comprises a first relief pattern and the surface of the substrate does not comprise a relief pattern.

26. The method of claim 21 wherein the surface of the substrate comprises a second relief pattern and the inked surface of the stamp does not comprise a relief pattern.

27. The method of claim 21 wherein the method comprises 10 seconds or less of print time.

* * * * *